United States Patent
Takizawa

(10) Patent No.: US 7,317,242 B2
(45) Date of Patent: Jan. 8, 2008

(54) SEMICONDUCTOR DEVICE INCLUDING P-TYPE SILICON LAYER INCLUDING IMPLANTED GERMANIUM

(75) Inventor: Teruo Takizawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/785,073

(22) Filed: Feb. 25, 2004

(65) Prior Publication Data

US 2004/0207051 A1    Oct. 21, 2004

(30) Foreign Application Priority Data

Feb. 25, 2003  (JP) ............................. 2003-047923

(51) Int. Cl.
*H01L 29/12* (2006.01)
(52) U.S. Cl. ................... 257/656; 257/613; 257/616; 257/655; 257/E29.336
(58) Field of Classification Search ................ 257/55, 257/63, 65, 616, 792; 438/166, 606, 252, 438/937
See application file for complete search history.

(56) References Cited

U.S. PATENT DOCUMENTS

| | | | | |
|---|---|---|---|---|
| 3,710,206 | A * | 1/1973 | Matsushita | 257/212 |
| 4,126,713 | A * | 11/1978 | DiBugnara | 438/543 |
| 4,575,925 | A * | 3/1986 | Kanbara et al. | |
| 5,610,790 | A * | 3/1997 | Staab et al. | |
| 6,049,109 | A * | 4/2000 | Omura et al. | 257/347 |
| 6,055,460 | A * | 4/2000 | Shopbell | |
| 6,111,289 | A * | 8/2000 | Udrea | 257/328 |
| 6,187,684 | B1 * | 2/2001 | Farber et al. | |
| 6,417,526 | B2 * | 7/2002 | Brown et al. | |
| 6,518,197 | B2 | 2/2003 | Hirose | |
| 2003/0059985 | A1 * | 3/2003 | Adkisson et al. | 438/149 |
| 2003/0071291 | A1 * | 4/2003 | Beamson | |
| 2003/0092213 | A1 * | 5/2003 | Yamazaki et al. | |
| 2003/0102534 | A1 * | 6/2003 | Huang | 257/656 |
| 2003/0137284 | A1 * | 7/2003 | DiPiazza | |
| 2003/0197598 | A1 * | 10/2003 | Hayashi | |
| 2004/0135235 | A1 * | 7/2004 | Poveda | 257/656 |

FOREIGN PATENT DOCUMENTS

JP          05-175536        *   7/1993

(Continued)

OTHER PUBLICATIONS

Streetman, "Solid State Electronic Devices," 1990, Prentice-Hall, Inc., third edition, p. 205.*

*Primary Examiner*—Leonardo Andujar
*Assistant Examiner*—Kevin Quinto
(74) *Attorney, Agent, or Firm*—Oliff & Berridge, PLC

(57) ABSTRACT

The invention provides a semiconductor device having a pn diode that includes a p-type SiGe layer and a n-type Si layer junctioned to the p-type SiGe layer. A built-in potential of the pn diode can be reduced, and thus obtaining a diode characteristics with lower impedance compared to the conventional scheme. Further, by forming a bridge-rectifier circuit with the pn diode or the like, alternating-current voltages can efficiently be converted into direct-current voltages. Accordingly, the invention provides a semiconductor device and method of manufacturing the same that can flow a larger electrical current in the forward direction of a diode by improving the voltage-current characteristics of the diode.

1 Claim, 13 Drawing Sheets

FOREIGN PATENT DOCUMENTS

| | | |
|---|---|---|
| JP | A 06-267971 | 9/1994 |
| JP | A 08-088377 | 4/1996 |
| JP | A 9-153628 | 6/1997 |
| JP | A 10-12883 | 1/1998 |
| JP | A 10-163506 | 6/1998 |
| JP | A 2001-118856 | 4/2001 |
| JP | A 2001-237434 | 8/2001 |
| JP | A 2002-299641 | 10/2002 |

* cited by examiner

F I G. 5
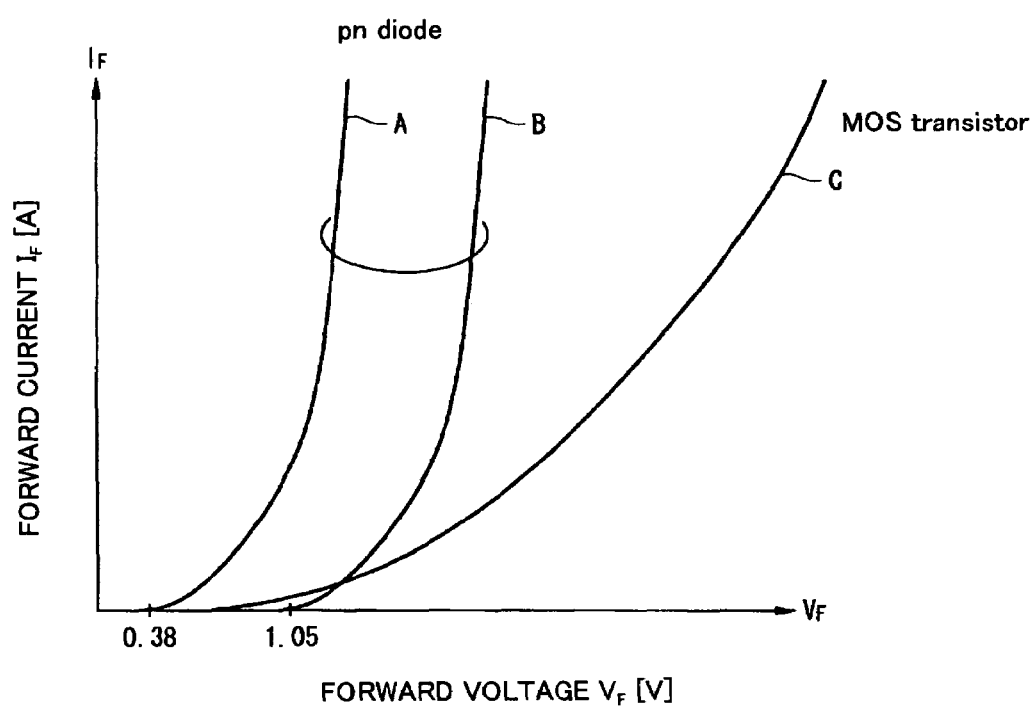

US 7,317,242 B2

SEMICONDUCTOR DEVICE INCLUDING P-TYPE SILICON LAYER INCLUDING IMPLANTED GERMANIUM

BACKGROUND OF THE INVENTION

1. Field of Invention

The present invention relates to a semiconductor device and a manufacturing method thereof. In particular, the invention relates to a semiconductor device suitable for an application of a single chip semiconductor device that is contained in, for example, IC (integrated circuit) cards, and can include a bridge-rectifier circuit, a smoothing capacitor, a nonvolatile memory chip, a CPU (central processing unit), and so on, and also to a manufacturing method of this semiconductor device.

2. Description of Related Art

Recently, IC cards have become increasingly popular for use as individual certification, and electronic money, and the like. The IC cards for these applications contain single chip semiconductor devices that can include bridge-rectifier circuits, smoothing capacitors, nonvolatile memory chips, CPUs, and so on.

In this semiconductor device, a coil antenna, a bridge-rectifier circuit, and a smoothing capacitor compose a power supply circuit section. By receiving magnetic field from outside of the IC card, electromotive force of alternating current appears in the coil antenna. The electromotive force is then full-wave-rectified by the bridge-rectifier circuit, and the rectified voltage is then smoothed by the smoothing capacitor into a constant voltage. The smoothed constant voltage of direct current is supplied to the CPU, the nonvolatile memory chip, and so on as the power supply.

The power supply circuit section mentioned above needs to convert a voltage of alternating current appeared in the coil antenna into a voltage of direct current by the bridge-rectifier circuit in order to perform prosecution of operations, such as an operation of the CPU or writing and reading operations of the nonvolatile memory chip.

FIG. 10(A) is a circuit diagram showing an example of configuration of a bridge-rectifier circuit 80 according to a first related art. As shown in FIG. 10(A), this bridge-rectifier circuit 80 consists of four pn diodes 90a-90d.

FIG. 10(B) is a cross-sectional diagram showing a structural example of the pn diode 90a built into the bridge-rectifier circuit 80. In FIG. 10(B), a reference numeral 91 denotes a silicon substrate, 93 denotes a p-type silicon (Si) layer, 95 denotes a n-type silicon (Si) layer, 96 denotes a component separation layer, 97 denotes an inter-layer insulation film, 99a and 99b denote aluminum interconnections. An impurity of p-type Si layer 93 is boron whose concentration is around $10^{20}$ cm$^{-3}$. An impurity of n-type Si layer 95 is phosphorous whose concentration is around $10^{19}$ cm$^{-3}$. Other pn diodes 90b-90d not shown in the figures have similar structures to pn diode 90a shown in FIG. 10(B). In the pn diode 90a, an Al interconnection 99a connected to the p-type Si layer 93 acts as an anode terminal, and an Al interconnection 99b connected to the n-type Si layer 95 acts as a cathode terminal.

It is also known that the bridge-rectifier circuit described above can be composed with four MOS transistors instead of the four pn diodes. FIG. 11 is a circuit diagram showing a bridge-rectifier circuit 80' according to a second related art. Four MOS transistors 90a'-90d' shown in FIG. 11 are enhancement-type pMOS transistors formed on the silicon substrate and have the same structures.

On the one hand, these MOS transistors 90a'-90d' have advantages that the forward current can easily be flowed because their threshold levels are easy to be adjusted. On the other hand, pn diodes can be designed to almost prevent the avalanche breakdown by adjusting the impurity concentration. From the above background, bridge-rectifier circuits have been composed of MOS transistors when emphasizing the characteristics with forward bias, or of pn diodes when emphasizing the characteristics with reverse bias.

FIG. 12 shows a band diagram of the pn diode 90a. The left part of FIG. 12 shows the energy band of the p-type Si layer 93, and the right part thereof shows the energy band of the n-type Si layer 95. In FIG. 12, if the p-type Si layer 93 and the n-type Si layer 95 are in the thermal equilibrium state, there is generated a built-in potential $\phi'$. It is known that the value of the built-in potential $\phi'$ is around 1.05 eV. See, for example, Japan laid-open patent publication No. 9-153628.

SUMMARY OF THE INVENTION

Incidentally, according to the semiconductor device of the related art, the pn diodes 90a-90d each consisting of the p-type Si layer 93 and the n-type Si layer 95 are used for the bridge-rectifier circuit 80 for full-wave-rectifying the alternating-current voltage into the direct-current voltage. However, since the built-in potential of these pn diodes 90a-90d is as much as around 1.05 eV, the forward voltage of not less than 0.8V is actually necessary to flow the forward current in pn diodes 90a-90d. Accordingly, it can be a problem that the impedance of the pn diodes 90a-90d is too high in comparison with the alternating-current voltages processed in the bridge-rectifier circuit to efficiently convert the alternating-current voltages to the direct-current voltages.

An object of the present invention is to provide a semiconductor device and a manufacturing method thereof, the semiconductor device having improved voltage-current characteristics of diodes resulting in larger forward current of the diodes.

A first semiconductor device according to the present invention has an aspect of including a diode. The diode can include a p-type silicon layer and a n-type silicon layer junctioned to the p-type silicon layer, the p-type silicon layer containing germanium.

Here, if the p-type silicon layer and the n-type silicon layer contact to each other, carriers of both layers are mutually diffused to be an equilibrium state resulting in matching of the Fermi levels. At this time, a potential difference called built-in potential appears between the p-type silicon layer and the n-type silicon layer. The built-in potential corresponds to an energy level difference between a conduction band of the p-type silicon layer and a conduction band of the n-type silicon layer. In the present invention, focusing on the fact that germanium injected in a silicon layer makes the band gap of the silicon layer narrower, germanium is introduced in the p-type silicon layer of the diode.

A second semiconductor device according to the present invention can include a diode. The diode can also include a p-type silicon layer, an intrinsic silicon layer junctioned to the p-type silicon layer, and a n-type silicon layer junctioned to the intrinsic silicon layer, the p-type silicon layer containing germanium.

A third semiconductor device according to the present invention has an aspect that, in the above-described semiconductor devices, the diode can be disposed on one of an insulating substrate and an insulation layer.

A fourth semiconductor device according to the present invention has an aspect that, of the above-described semiconductor devices, a plurality of diodes can be provided, and the fourth semiconductor device further can include a bridge-rectifier circuit that has the diodes, and rectifying a predetermined alternating-current voltage to a direct-current voltage.

A fifth semiconductor device according to the present invention has an aspect of, of the above semiconductor device, and can include a coil antenna connected to one side of the bridge-rectifier circuit, and a smoothing capacitor connected to the other side of the bridge-rectifier circuit. The coil antenna generating an alternating-current voltage by electromagnetic induction, the bridge-rectifier circuit rectifying the alternating-current voltage supplied thereto into a direct-current voltage, and the smoothing capacitor smoothing the direct-current voltage supplied thereto into a constant voltage.

According to the above semiconductor device, the band gap of the p-type silicon layer that forms the diode is narrowed in comparison with the conventional semiconductor device. Therefore, the built-in potential between the p-type silicon layer and the n-type silicon layer of the diode can be reduced, thus making the impedance of the diode lower.

Thus, the voltage-current characteristics of the diode can be improved, and larger electrical current can be flowed in the forward direction of the diode. Furthermore, by forming the bridge-rectifier circuit with this diode, alternating-current voltages can efficiently be converted into direct-current voltages.

A method of manufacturing a semiconductor device according to the present invention is a manufacturing method of a diode having a p-type silicon layer and a n-type silicon layer junctioned to the p-type silicon layer. The method can include the step of forming silicon-germanium mixed crystal by implanting germanium to the p-type silicon layer. According to the method of manufacturing a semiconductor device related to the present invention, the built-in potential between the p-type silicon layer and the n-type silicon layer can be reduced, thus making the impedance of the diode lower. Thus, the voltage-current characteristics of the diode can be improved, and larger electrical current can be flowed in the forward direction of the diode.

BRIEF DESCRIPTION OF THE DRAWINGS

The invention will be described with reference to the accompanying drawings, wherein like numerals reference like elements, and wherein:

FIG. 2 shows a plan view and a cross-sectional view illustrating a structural example of a pn diode 5a;

FIG. 3 is a process chart (part 1) showing an exemplary manufacturing method of the pn diode 5a;

FIG. 4 is a process chart (part 2) showing an exemplary manufacturing method of the pn diode 5a;

FIG. 5 shows voltage-current characteristics of the pn diode Sa, 90a, and so on;

FIG. 7 shows a plan view and a cross-sectional view illustrating a structural example of a pin diode 105a;

FIG. 8 is a process chart showing an exemplary manufacturing method of the pin diode 105a;

FIG. 9 shows a band diagram of the pn diode 5a;

FIG. 10 shows diagrams illustrating an application example and a structural example of the pn diode 90a;

FIG. 12 shows a band diagram of the pn diode 90a; and

DETAILED DESCRIPTION OF PREFERRED EMBODIMENTS

A semiconductor device and a manufacturing method thereof according to an embodiment of the present invention are hereinafter described with reference to the accompanying drawings.

Figure 1:
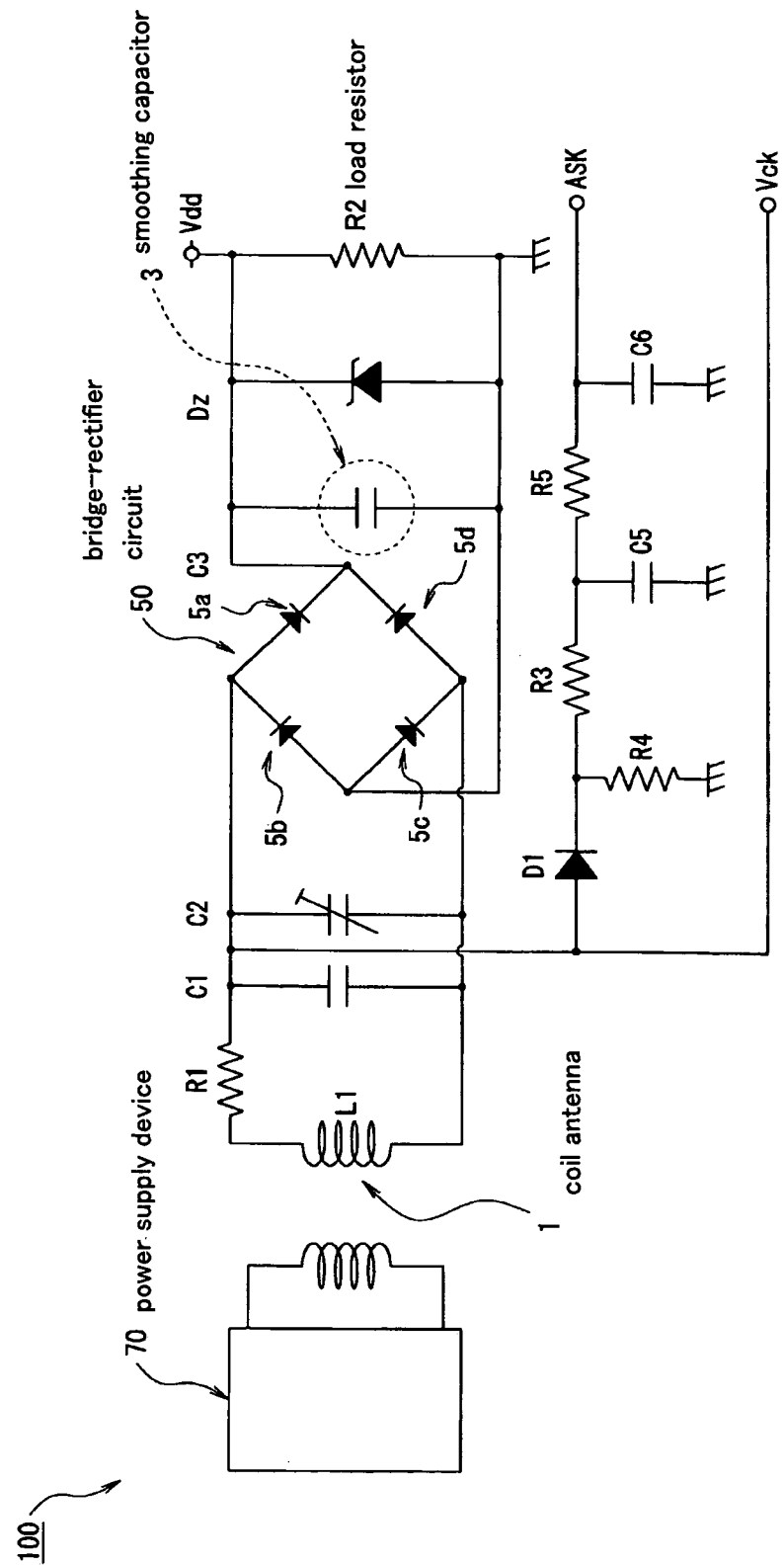
FIG. 1 is an exemplary circuit diagram showing a configuration example of a semiconductor device 100.

FIG. 1 is an exemplary circuit diagram showing an example of configuration of a semiconductor device 100 according to an embodiment of the present invention. The semiconductor device 100 contained in, for example, a noncontact ID card converts alternating-current voltages obtained by electromagnetic induction into direct-current voltages, and then performs predetermined calculations or memory operations using the direct-current voltages as a power source ($V_{dd}$).

The semiconductor device 100 can include a bridge-rectifier circuit 50 connected to a coil antenna 1, a smoothing capacitor 3 connected to the bridge-rectifier circuit 50, a CPU and a nonvolatile memory chip (not shown in the drawings) connected to both the bridge-rectifier circuit 50 and the smoothing capacitor 3, and the like.

In FIG. 1, a power supply device 70 is provided outside of the IC card, and generates magnetic field by flowing predetermined electric current in a coil of the power supply device 70. The coil antenna 1 generates electromotive force of alternating current in response to the magnetic field. The electromotive force has a sinusoidal waveform repeatedly taking a positive electric potential and a negative electric potential as shown in FIG. 13.

Figure 13A:
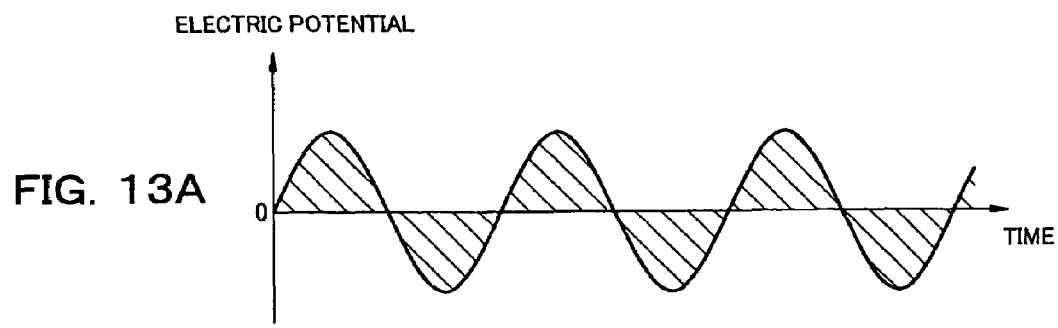
FIG. 13 is a schematic diagram showing an example process of rectifying and smoothing an electromotive force.
Figure 13B:
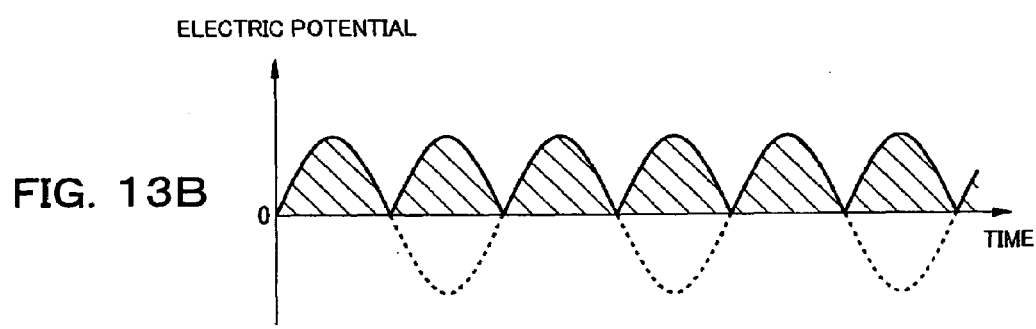
Figure 13C:
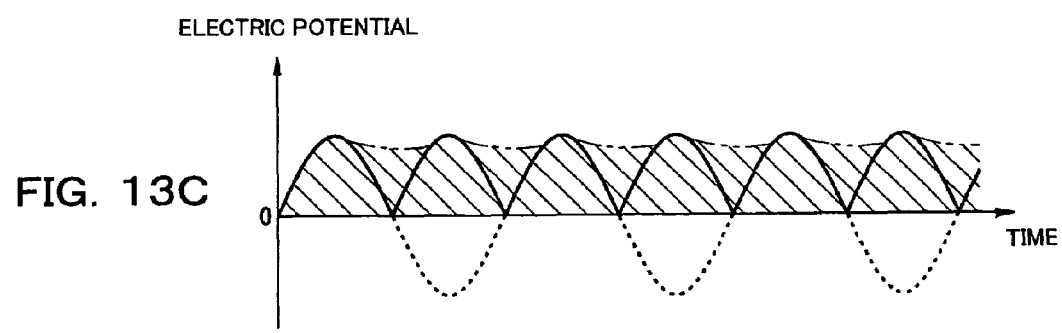

The bridge-rectifier circuit 50 full-wave-rectifies the alternating-current voltage shown in FIG. 13(A) into the waveform shown in FIG. 13(B). The bridge-rectifier circuit 50, for example, converts the alternating-current voltage into the positive direct-current voltage by inverting the negative components of the alternating-current voltage waveform obtained by the coil antenna 1 to the positive components thereof.

As shown in FIG. 1, the bridge-rectifier circuit includes, for example, four pn diodes 5a-5d. Theses four pn diodes 5a-5d have the same structures. The structures of the pn diodes 5a-5d will be described in greater detail below.

If the input voltage to the bridge-rectifier circuit 50 is the positive component of the waveform, the electric current flows through the pn diodes 5a and 5d, and the positive waveform appears between both terminals of the smoothing capacitor 3. Also, if the input voltage to the bridge-rectifier circuit 50 is the negative component of the waveform, the electric current flows through the pn diodes 5b and 5c, and the positive waveform also appears between the both terminals of the smoothing capacitor 3.

The smoothing capacitor 3 repeats charge and discharge operations in accordance with the rectified voltage, the positive waveform output by the bridge-rectifier circuit 50, thus smoothing the rectified voltage into the constant voltage.

The CPU, the nonvolatile memory chip, and so on not shown in the drawings are connected to the $V_{dd}$ terminal shown in FIG. 1. The rectified voltage smoothed by the smoothing capacitor 3 as the constant voltage is supplied to the $V_{dd}$ terminal and used as the power source for the CPU and the nonvolatile memory chip. The semiconductor device 100 is formed as a single chip containing the bridge-rectifier circuit 50, the smoothing capacitor 3, and other components not shown such as the CPU or the nonvolatile memory chip.

Figure 2A:
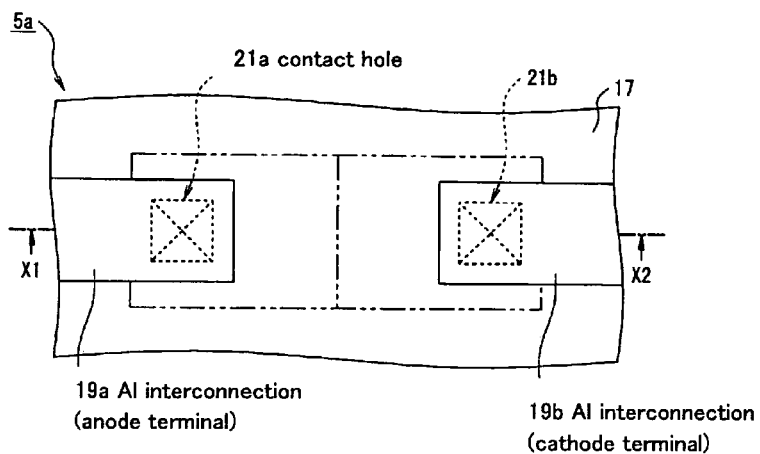
Figure 2B:
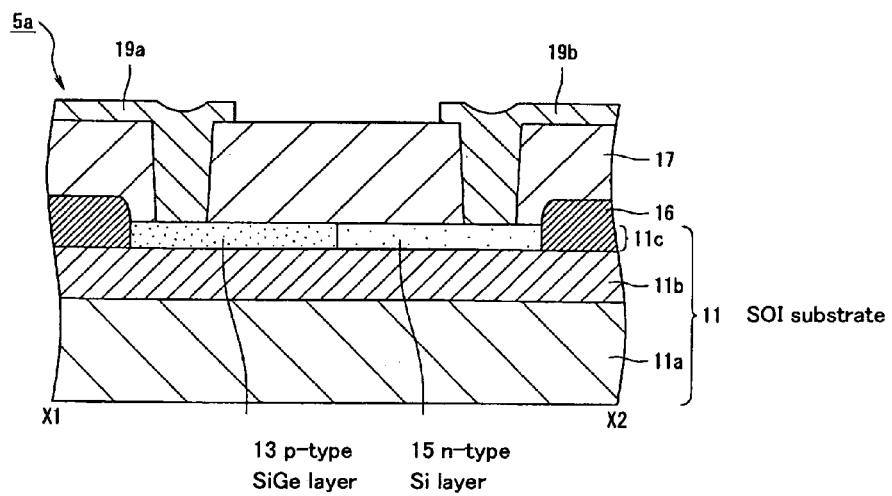

FIGS. 2(A) and 2(B) show a plan view illustrating a structural example of the pn diode 5$a$ and its cross-sectional view along the arrow of X1-X2, respectively. As described above, this pn diode 5$a$ is one of the four pn diodes forming the bridge-rectifier circuit 50. Although not shown, the other three pn diodes 5$b$-5$d$ have the same structures as the pn diode 5$a$. Hereinafter, the structure of the pn diode 5$a$ will be explained.

In FIG. 2(B), the reference numeral 11 denotes a SOI (silicon on insulator) substrate, 13 denotes a p-type silicon-germanium mixed crystal layer (hereinafter referred to as p-type SiGe layer), 15 denotes n-type silicon layer (hereinafter referred to as n-type Si layer), 16 denotes a component separation layer, 17 denotes an inter-layer insulation film, and 19$a$ and 19$b$ denote Al interconnections.

The SOI substrate 11 can include a silicon substrate 11$a$, a insulation layer 11$b$ made from a silicon oxide film or the like, and a single-crystal silicon layer 11$c$ formed on the insulation layer 11$b$. Such a SOI substrate can be manufactured by the SIMOX (separation by implant oxygen) method or the bonding method. Further, the other part of the silicon layer 11$c$ than component forming area thereof is thermally oxidized to form the component separation layer 16.

By using the SOI substrate 11, the pn diode 90$a$ can completely be separated from other components, thus preventing latch-up in the semiconductor device 100. Furthermore, by using the SOI substrate 11, parasitic capacitance of the pn diode 90$a$ can be reduced, thus increasing operational speed of the semiconductor device 100.

The p-type SiGe layer 13 and the n-type Si layer 15 are formed within an area of the semiconductor layer 11$c$ surrounded by the component separation layer 16. As shown in FIG. 2(B), the p-type SiGe layer 13 and n-type Si layer are joined to each other side by side.

The inter-layer insulation film 17 is a silicon oxide film provided on the SOI substrate 11 by, for example, CVD (chemical vapor deposition) process. The upper surface of the inter-layer insulation film 17 is planarized by, for example, CMP (chemical mechanical polish) process. Further, there are provided contact holes in the inter-layer insulation film 17 for providing openings above the p-type SiGe layer 13 and n-type Si layer 15.

The Al interconnections 19$a$ and 19$b$ are provided on the planarizing-processed inter-layer insulation film 17. As shown in FIG. 2(A), Al interconnection 19$a$ is connected to the p-type SiGe layer 13 through the contact hole 21$a$. This Al interconnection 19$a$ serves as an anode terminal. Further, the Al interconnection 19$b$ is connected to the n-type Si layer 15 through the contact hole 21$b$. This Al interconnection 19$b$ serves as a cathode terminal.

In FIG. 2(B), impurity ion included in the p-type SiGe layer 13 is, for example, boron (B) whose concentration is around $10^{20}$ through $10^{21}$ cm$^{-3}$. And, impurity ion included in the n-type Si layer 15 is, for example, phosphorous (P) whose concentration is around $10^{19}$ though $10^{20}$ cm$^{-3}$. The type of the junction between the p-type SiGe layer 13 and the n-type Si layer 15 is, for example, the one-sided abrupt junction.

Figure 9:
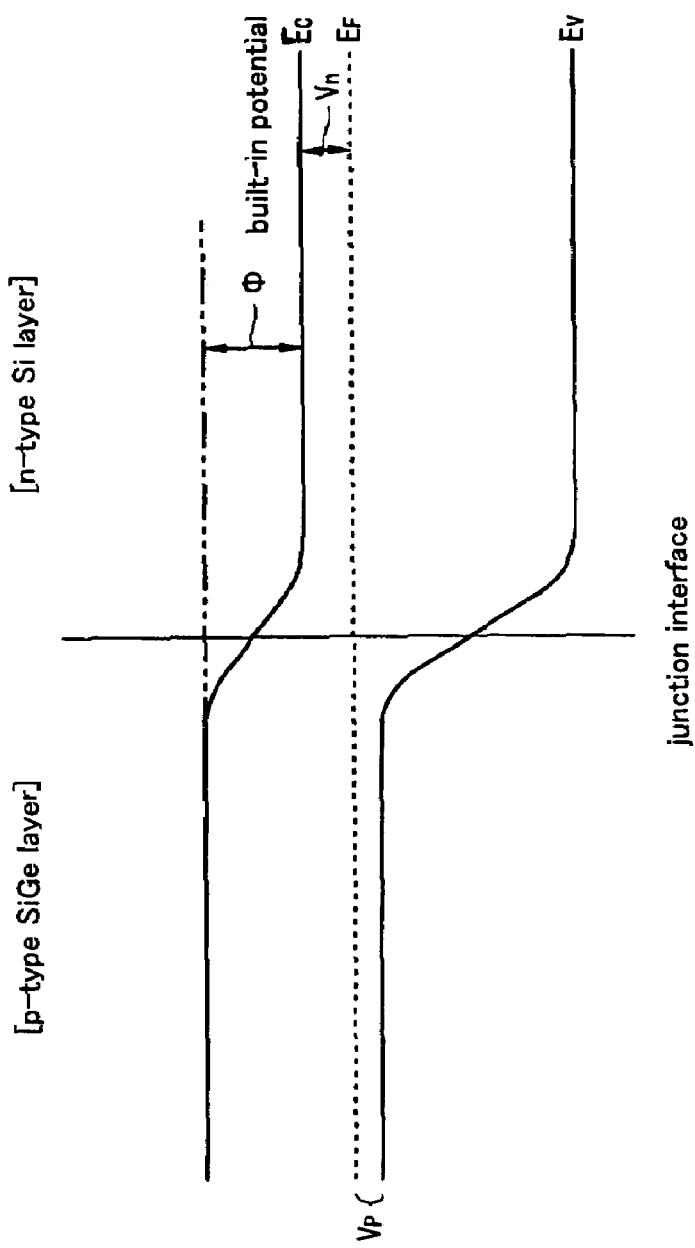
Figure 10A:
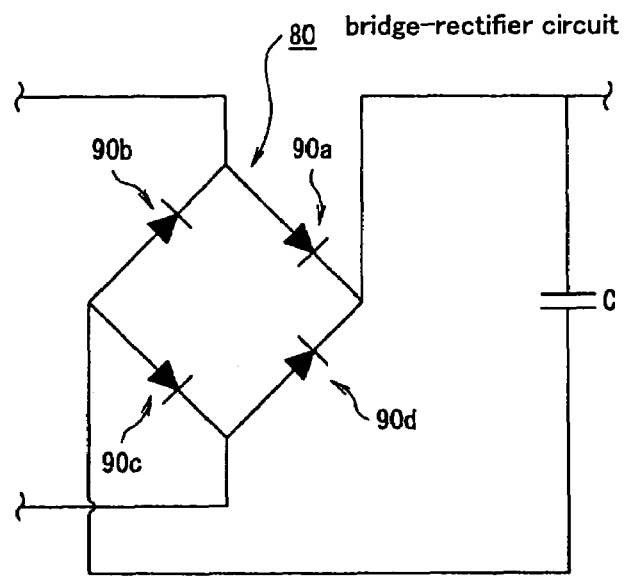
Figure 10B:
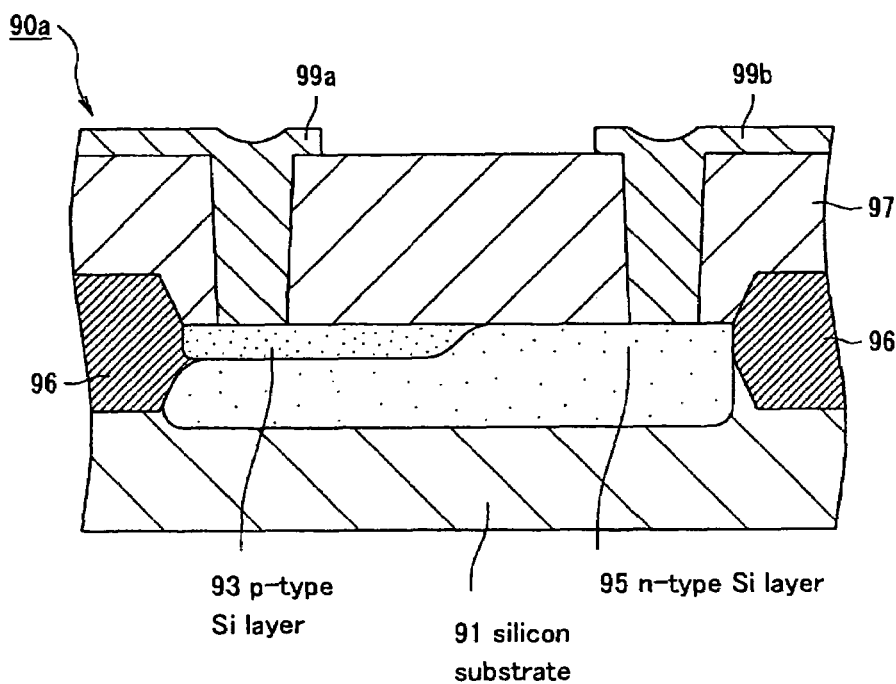
Figure 11:
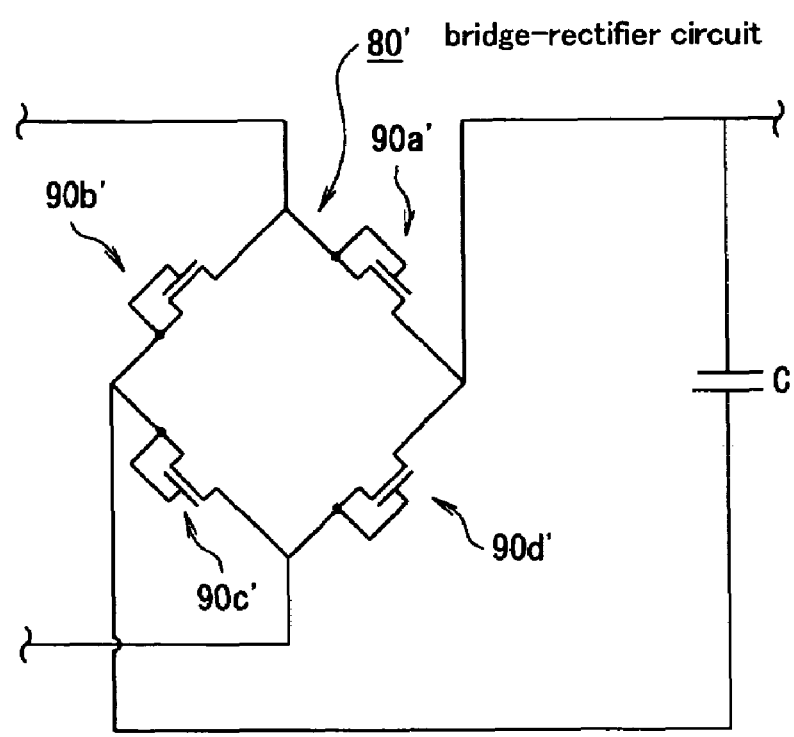
FIG. 11 is an exemplary circuit diagram showing an application example of a MOS transistor 90a'.
Figure 12:
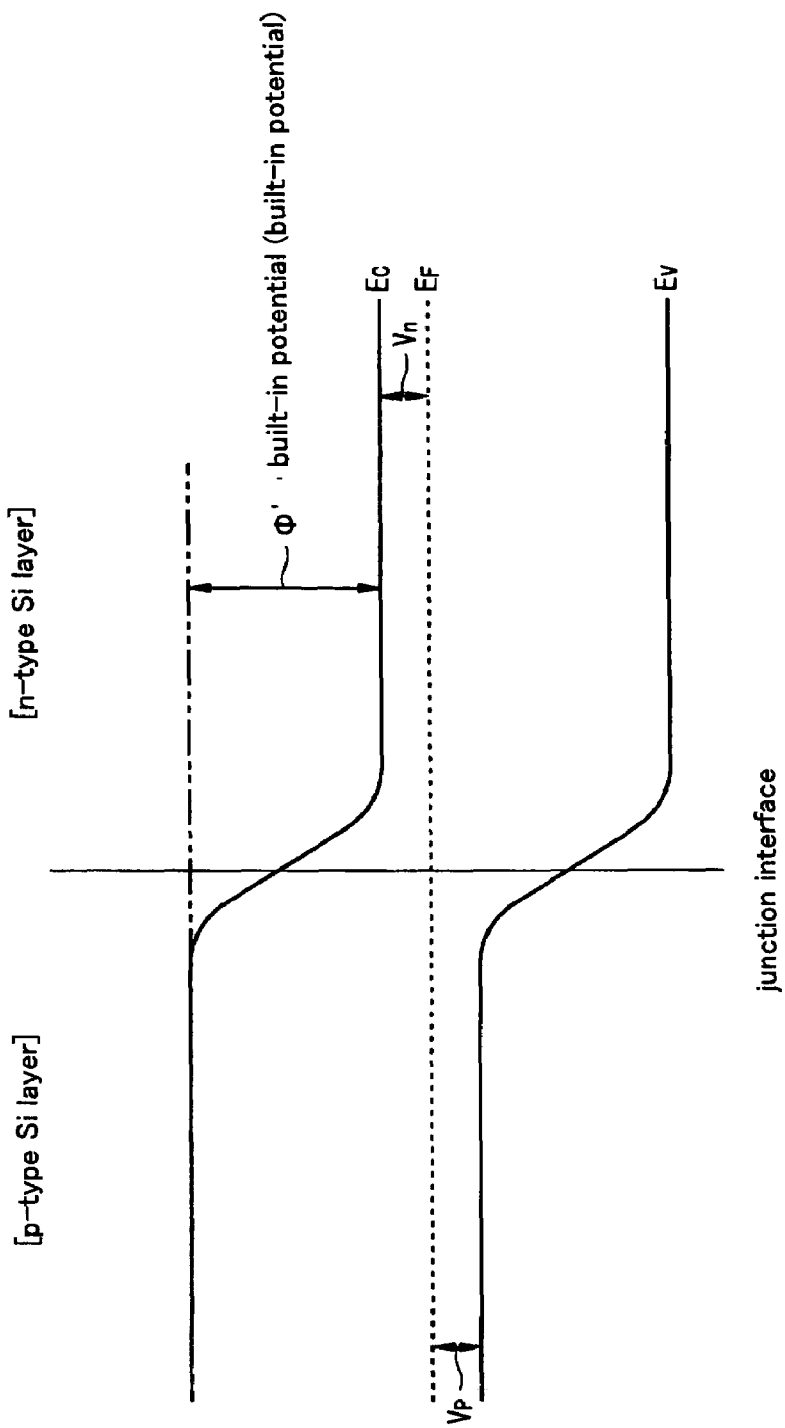

FIG. 9 shows a band diagram of the pn diode 5$a$. The left portion of FIG. 9 shows the energy band of the p-type SiGe layer 13, and the right portion thereof shows the energy band of the n-type Si layer 15. In FIG. 9, $E_v$ denotes an energy level of the valence electron band, $E_c$ denotes an energy level of the conductive band, and $E_F$ denotes a Fermi potential. In addition, $V_n$ denotes a potential difference between the energy level of the conductive band and the Fermi potential, $V_p$ denotes a potential difference between the energy level of the valence electron band and the Fermi potential, and $\phi$ denotes a built-in potential.

As shown in FIG. 9, the Fermi potential $E_F$ is positioned near the energy level of the valence electron band $E_v$ in the p-type SiGe layer, and in the n-type Si layer the Fermi potential $E_F$ is positioned near the energy level of the conductive band $E_c$. And, the Fermi potentials in the both layers are balanced in the thermal equilibrium state.

In the pn diode 5$a$, the built-in potential $\phi$ is expressed by the following equation (1).

$$q\varphi = [E_c(Si) - qV_n] - [E_v(SiGe) - qV_p] \quad (1)$$
$$= E_c(Si) - E_v(SiGe) - q(V_n - V_p)$$
$$= E_c(Si) - E_v(Si) - q(V_n - V_p) - \Delta E_v(SiGe)$$
$$\approx q\varphi^{pn}(Si) - \Delta E_v(SiGe)$$

where:
$E_c(Si)$ denotes the energy level of the conductive band in the silicon (Si) crystal; $E_v(SiGe)$ denotes the energy level of the valence electron band in the silicon-germanium mixed crystal; $E_v(Si)$ denotes the energy level of the valence electron band in the Si crystal; and $\Delta E_v(SiGe)$ denotes a discontinuity value of the valence electron band of the SiGe mixed crystal against that of the silicon crystal.

Here, assuming that the impurity concentration of the p-type SiGe layer 13 is $10^{20}$ cm$^{-3}$, and the impurity concentration of the n-type Si layer 15 is $10^{19}$ cm$^{-3}$, $\phi^{pn}(Si)$ is estimated as around 1.05 [eV]. Meanwhile, it is known that $\Delta E_v(SiGe)$ is expressed by the following equation (2).

$$\Delta E_v(SiGe) = 0.84 - 2.41(a - 5.43)[eV] \quad (2)$$

where $a$ denotes a lattice constant of the SiGe mixed crystal. For example, assuming that a composition ratio of the Ge in the SiGe mixed crystal is 60%, and the lattice constant is 5.50 Å, '$a$=5.50' is applied to the equation (2).

$$\Delta E_v(SiGe) = 0.84 - 2.41(5.50 - 5.43) \quad (2)'$$
$$= 0.67 \ [eV]$$

Further, '$\Delta E_v(SiGe)$=0.67' and '$\phi^{pn}(Si)$=1.05 [eV]' are applied to the equation (1).

$$q\varphi = q\varphi^{pn}(Si) - \Delta E_v(SiGe) \quad (1)'$$
$$= 1.05 - 0.67$$
$$= 0.38 \ [eV]$$

FIG. 5 is a comparative graph showing voltage-current characteristics of the pn diodes 5$a$ and 90$a$. In FIG. 5, the horizontal axis denotes the forward voltage $V_F$, and the vertical axis denotes the forward current $I_F$. In the graph, a curve A expresses the voltage-current characteristics of the pn diode 5a according to the present invention, a curve B expresses the voltage-current characteristics of the pn diode 90a according to related art. A curve C expresses the voltage-current characteristics of the MOS transistor 90a'.

It is generally known that the forward current IF of the pn diode is expressed by the following equation (3).

$$IF=\alpha\{eq(VF-\phi)/KT-1\} \qquad (3)$$

where $\alpha$ is a constant, K denotes the Boltzmann constant, and T denotes the absolute temperature.

As described above, the built-in potential $\phi$ of the pn diode 5a formed of the p-type SiGe layer 13 and the n-type Si layer 15 is around 0.38 [eV] while the built-in potential $\phi'$ of the conventional type pn diode 90a is around 1.05 [eV].

Therefore, it is apparent from the equation (3) that in the conventional pn diode 90a the forward current $I_F$ theoretically starts flowing when the forward voltage $V_F$ reaches 1.05 [V] while in the pn diode according to the present invention the $I_F$ starts flowing when the $V_F$ reaches as low as 0.38[V].

Accordingly, since the built-in potential $\phi$ of the pn diode 5a can be reduced by half in comparison with the conventional type pn diode 90a, as shown in FIG. 5, higher rising rate of the forward current $I_F$ in response to the forward voltage $V_F$ can be obtained resulting in a larger current flow.

Furthermore, it is known that the forward current $I_F$ of the MOS transistor 90a' is expressed by the following equation (4).

$$IF=\alpha(VF-Vth)2 \qquad (4)$$

where $V_{th}$ denotes a threshold voltage of the MOS transistor 90a'. Accordingly, the forward current IF increases exponentially in accordance with the voltage while the forward current IF of the MOS transistor 90a' increases in a rate of the square. Therefore, the pn diode 5a according to the present invention can flow larger current than the MOS transistor 90a'.

As described above, the semiconductor device according to the present invention can offer a lower built-in potential $\phi$ between the p-type Si layer and the n-type Si layer in the pn diode to lower impedance of the pn diode. Thus, the voltage-current characteristics can be improved to obtain larger current flow in the forward direction of the on diode.

Furthermore, since the bridge-rectifier circuit 50 is formed of such low impedance pn diodes 5a-5d, the semiconductor device 100 can efficiently convert alternating-current voltages to direct-current voltages. Accordingly, if a low electromotive force is generated in the coil antenna, the CPU or other components can operate, thus contributing to, for example, enhancement of the distance of noncontact certification.

In the first embodiment, the p-type SiGe layer 13 corresponds to the p-type silicon layer of the present invention, and the n-type Si layer 15 corresponds to the n-type silicon layer of the present invention. Further, the pn diodes 5a-5d correspond to the diodes of the present invention, the insulation layer 11b forming the SOI substrate 11 corresponds to the insulating substrate or the insulation layer of the present invention. Still further, the semiconductor device 100 corresponds to the semiconductor device of the present invention.

Figure 3A:
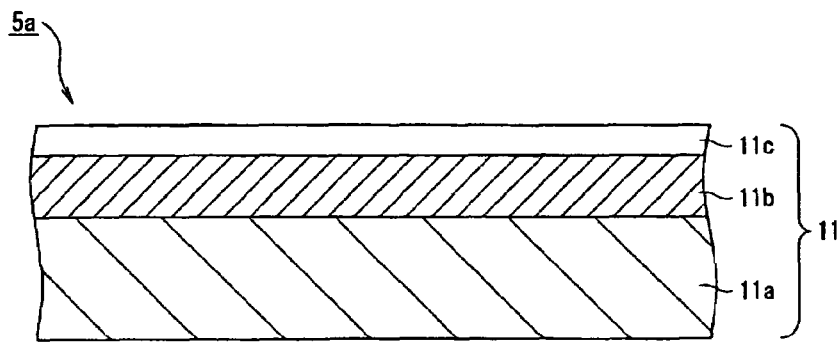

Next, a manufacturing method of the pn diode 5a described above will be explained with referring to FIGS. 3(A) through 4(C). Firstly, as shown in FIG. 3(A), providing the SOI wafer in which the single-crystal silicon layer 11c is formed on the silicon substrate 11a through the silicon oxide film 11b.

Figure 3B:
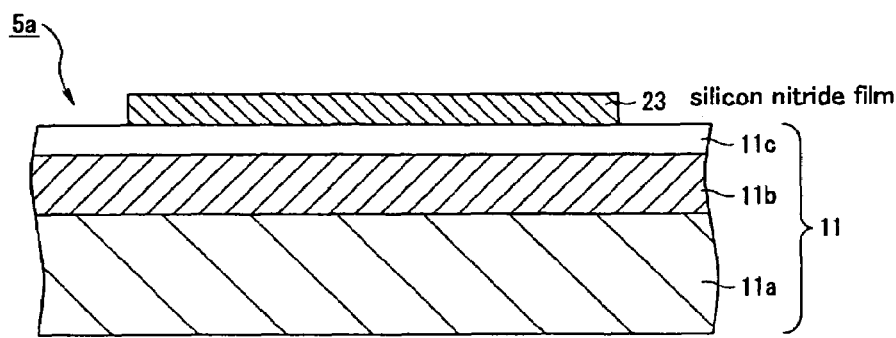
Figure 3C:
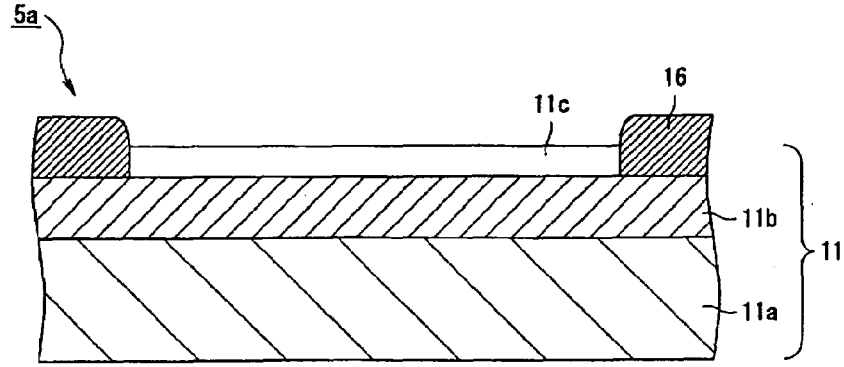

Next, by LOCOS (local oxidation of silicon) method, the component separation layer 16 is formed on the other part of the SOI substrate than the component forming areas. In other words, before all, a silicon nitride film is deposited on the single-crystal silicon layer 11c of the SOI wafer 11. The deposition of the silicon nitride film 23 is carried out by, for example, CVD process. Then, as shown in FIG. 3(B), the silicon nitride film except on the component forming areas is removed by a photolithography process followed by a dry etching process. And then, only a part of the single-crystal silicon layer 11c exposed through the opening of the silicon nitride film 23 is thermally-oxidized to form the component separation layer 16. After then, the silicon nitride film 23 is removed from the SOI substrate 11 as shown in FIG. 3(B) by wet etching with hot phosphoric acid.

Figure 4A:
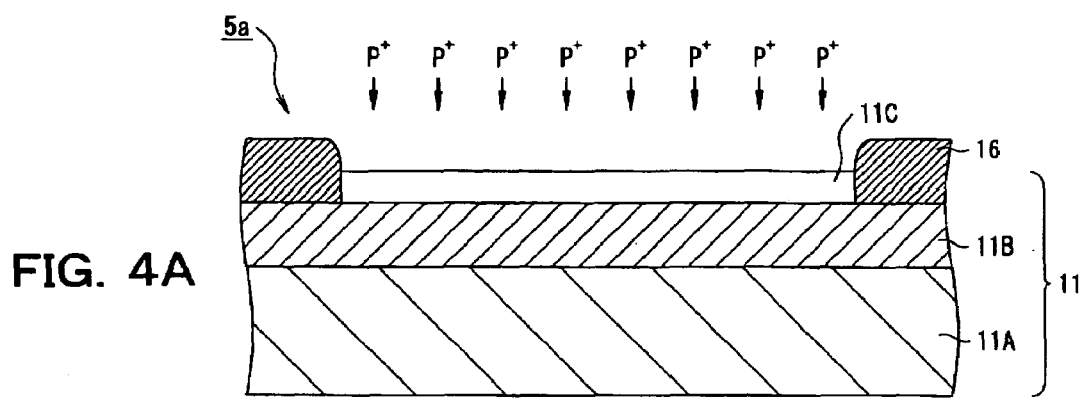

Then, as shown in FIG. 4(A), phosphorus (P) is ion-implanted to the single-crystal silicon layer 11c with the component separation layer formed. The ion-implantation condition of phosphorus includes, for example, implanting energy of around 40 keV and dose amount of around $1\times10^{14}$-$10^{15}$ cm$^{-2}$.

Figure 4B:
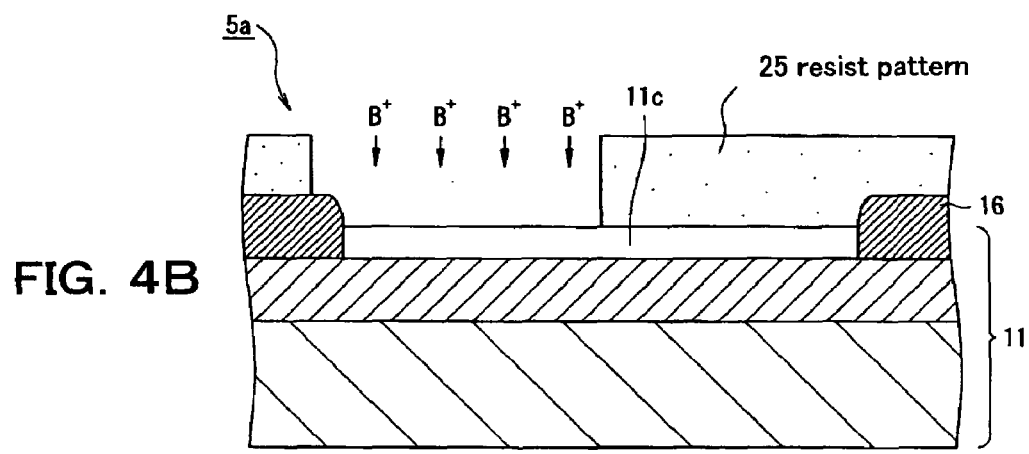

And then, as shown in FIG. 4(B), a resist pattern 25 is formed on the SOI substrate 11 by photolithography process, the resist pattern having openings only corresponding positions to the areas where the p-type layer is formed (hereinafter referred to as p-type forming areas). After then, using the resist pattern 25 as a mask, boron (B) is ion-implanted to the single-crystal silicon layer 11c. The ion-implantation condition of boron includes, for example, implanting energy of around 17 keV and dose amount of around $1\times10^{15}$-$5\times10^{15}$ cm$^{-2}$.

Further, using the resist pattern 25 as a mask, germanium (Ge) is further ion-implanted to the single-crystal silicon layer 11c where boron has been ion-implanted. The ion-implantation condition of germanium includes, for example, implanting energy of around 20 keV and dose amount of around $1\times10^{14}$-$5\times10^{15}$ cm$^{-2}$. The resist pattern 25 is then removed by ashing after the ion-implantation of germanium.

Figure 4C:
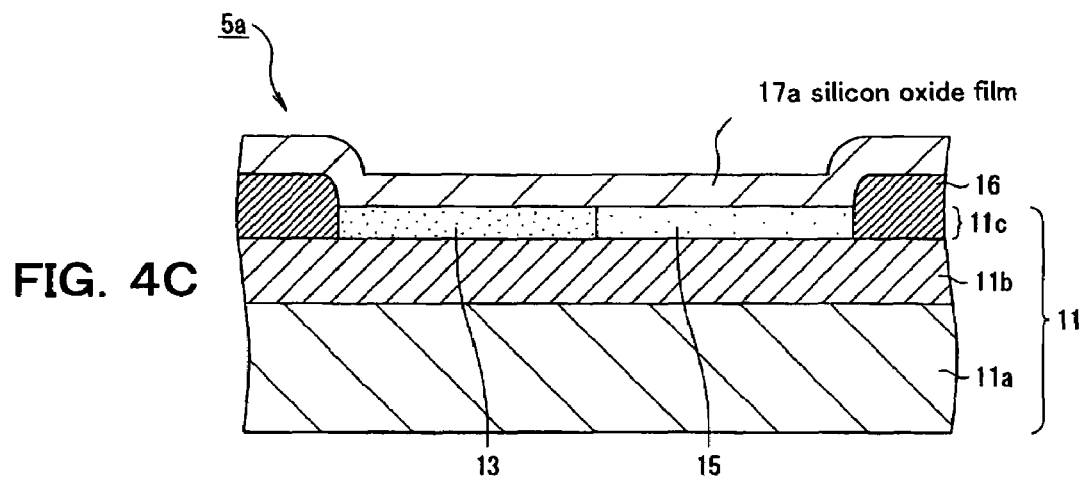

Next, as shown in FIG. 4(C), the silicon oxide film 17a is then deposited for a predetermined thickness on the single-crystal silicon layer 11c on which germanium, boron, and phosphorus are ion-implanted and the component separation layer 16. Then, a high temperature thermal treatment is applied to the SOI substrate 11 with the silicon oxide film deposited thereon to activate the impurities such as germanium, boron, or phosphorus ion-implanted to the single-crystal silicon layer 11c. An example of the silicon oxide film 17a is TEOS film with thickness of 1000 Å. Further, one example of the high temperature thermal treatment is a high-speed and high-temperature thermal treatment with treatment temperature of 1040° C. and treatment period of around 30 seconds.

Next, a silicon oxide film of around 8000 Å is further deposited on the silicon oxide film 17a by CVD process. And then, the surface of the silicon oxide film is planarized by, for example, CMP process, thus forming the inter-layer insulation film 17 (See FIG. 2.). Further, contact holes 21a and 21b (See FIG. 2.) are provided in the inter-layer insulation film 17 by photolithography followed by dry etching.

After then, the Al film is deposited by sputtering method on the inter-layer insulation film 17 with the contact holes 21a and 21b provided therein. And then the Al film is patterned as a form of interconnections by photolithography process followed by dry etching process to form the Al interconnections 19a and 19b (See FIG. 2.). Thus, the pn diode 5a as shown in FIG. 2(B) is completed.

The whole manufacturing process of the pn diode 5a is performed at the same time as or continuously to manufacturing process of other pn diodes 5b-5d, CMOS transistors, or MOS capacitors formed on the SOI substrate 11, and has integrity with manufacturing process of MOS. Therefore, the low impedance pn diodes 5a-5d can be formed without a substantial rise in manufacturing cost in comparison with the conventional method.

Note that, in this embodiment, only the case in which germanium is ion-implanted to the single-crystal silicon layer 11 of the p-type forming areas to form the p-type SiGe layer 13 is explained. However, it should be understood that the injection method of germanium is not limited to the ion-implantation method. It is possible to provide germanium on the single-crystal silicon layer by, for example, ultra-high vacuum epitaxial technology, MOCVD (metal organic CVD) technology, or MBE (molecular beam epitaxy) technology followed by the high temperature thermal treatment to form the p-type SiGe layer 13. Even in this case, the built-in potential of the pn diodes 5a-5d can be reduced to obtain diode characteristics of low impedance.

In the embodiment described above, a case is explained in which the bridge-rectifier circuit is formed of the pn diodes 5a-5d each having a structure in which the p-type SiGe layer 13 and the n-type Si layer 15 are junctioned to each other on only one side thereof. However, the junction formation of the p-type SiGe layer 13 and the n-type Si layer 15 is not limited to this one-sided junction.

Figure 6A:
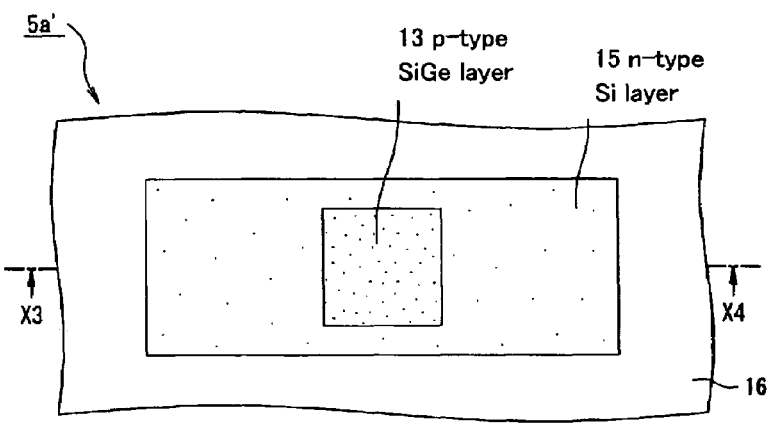
FIG. 6 shows a plan view and a cross-sectional view illustrating a structural example of a pn diode 5a'.
Figure 6B:
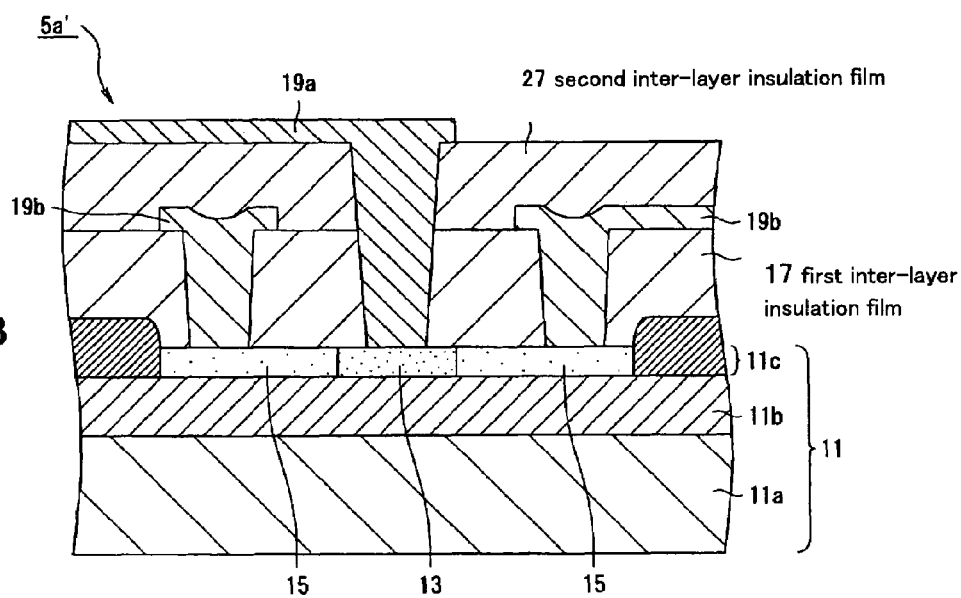

FIGS. 6(A) and 6(B) respectively show a plan view illustrating a structural example of a pn diode 5a' according to the second embodiment of the present invention and a cross-sectional view along the X3-X4 arrow. In this embodiment, it is assumed that the p-type SiGe layer 13 and the n-type Si layer 15 are junctioned on both sides of the p-type SiGe layer 13. Therefore, in FIGS. 6(A) and 6(B), the same reference numerals are used for the same elements as of the pn diodes 5a described above, and detailed explanations will be omitted. Additionally, for the sake of convenience of explanations, the inter-layer insulation film and the Al interconnections are also omitted from the drawings.

As shown in FIG. 6(A), the pn diode 5a' has the n-type Si layer 15 of a ring shape, and the p-type SiGe layer 13 is disposed in a center portion of the n-type Si layer 15. Accordingly, since an area of the junction of the n-type Si layer and the p-type SiGe layer can be increased, a larger forward current can flow than the case of the pn diode 5a shown in FIG. 2. Further, by forming the bridge-rectifier circuit 50 shown in FIG. 1 with the pn diode 5a, the efficiency of converting alternating-current voltages to direct-current voltages can be further enhanced.

Next, a manufacturing method of the pn diode 5a' will be explained. The process of forming a first inter-layer insulation film 17 shown in FIG. 6(B) and the preceding processes are the same as those for the pn diode 5a (provided, however, that the photo mask for defining each of the areas for forming the p-type SiGe layer 13 and the n-type Si layer 15 is different from that for the pn diode 5a). After forming the first inter-layer insulation film 17, the contact holes are provided by photolithography process and dry etching process in the first inter-layer insulation film 17 above the n-type Si layer 15. And then, the Al interconnections 19B for the cathode terminals are formed so that the contact holes are filled in with the Al interconnections 19B.

Next, the insulation layer, such as a silicon oxide film, is deposited on the first inter-layer insulation film and then planarized to form a second inter-layer insulation film 27. Then, the contact holes are provided by photolithography process and dry etching process in the inter-layer insulation films 17 and 27 above the p-type SiGe layer 13. And then, the Al interconnections 19a for the anode terminals are formed so that the contact holes are filled in with the Al interconnections 19a. The pn diode 5a' is completed by the above processes.

As the embodiments as described above, the case is explained in which the bridge-rectifier circuit 50 is formed with the pn diodes each comprising the p-type SiGe layer 13 and the n-type Si layer 15. However, it should be understood that in the semiconductor device 100 according to the present invention, the components for forming the bridge-rectifier circuit 50 are not limited to the pn diodes.

Figure 7A:
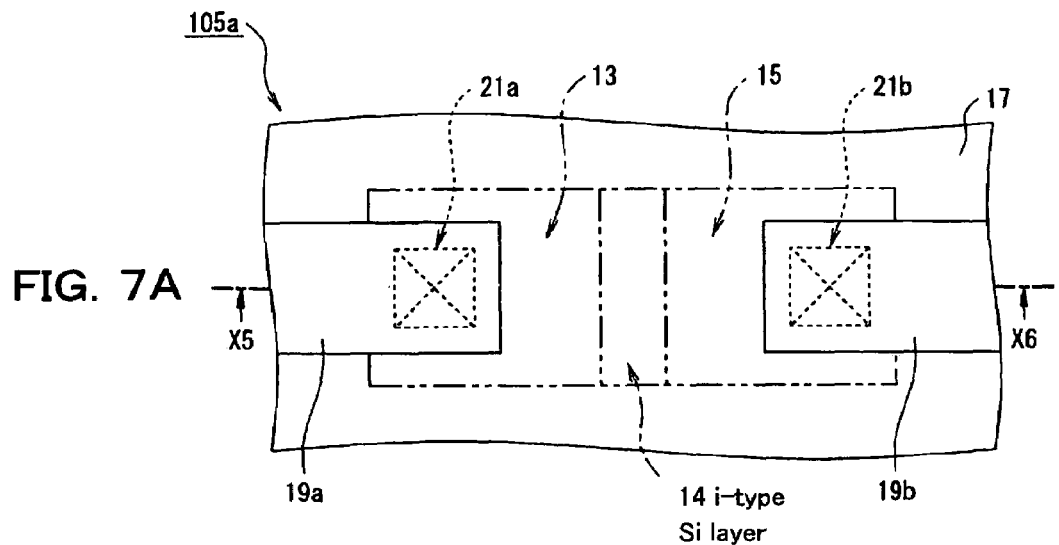
Figure 7B:
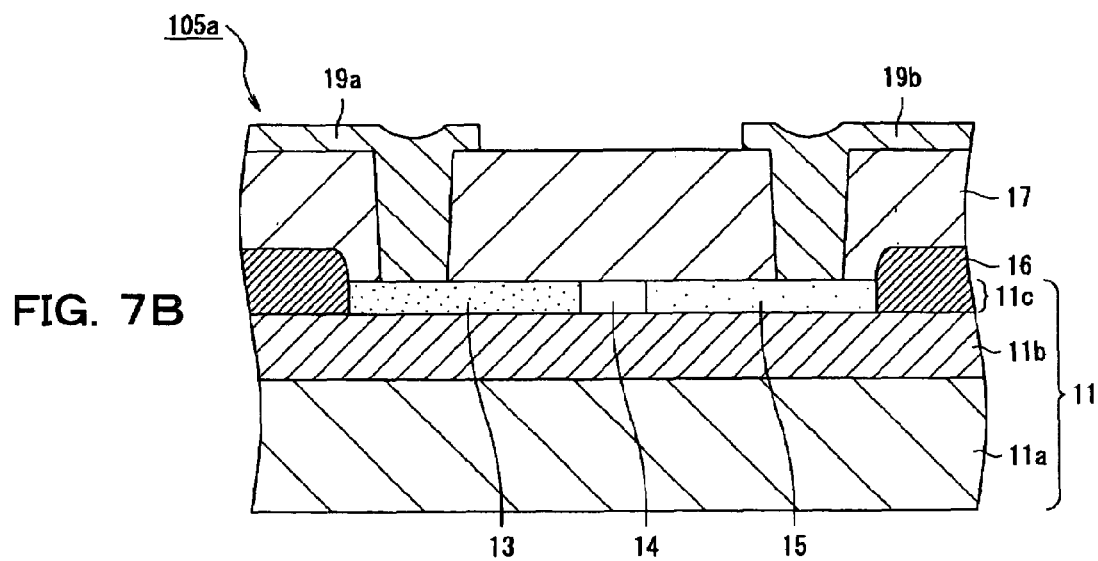

FIGS. 7(A) and 7(B), respectively, show a plan view illustrating a structural example of a pin diode 105a according to the third embodiment of the present invention and a cross-sectional view along the X5-X6 arrow. In FIGS. 7(A) and 7(B), the same reference numerals are used for the same elements as of the pn diodes 5a described above, and detailed explanations will be omitted.

As shown in FIG. 7, the pin diode 105a has an intrinsic Si layer (hereinafter referred to as i-type Si layer) 14 provided between the p type SiGe layer 13 and n-type Si layer 15. Since the concentration of electric field to the depletion layer between the p-type SiGe layer 13 and the n-type Si layer 15 can be prevented by this structure, the breakdown voltage of reverse direction can be increased. Furthermore, by forming the bridge-rectifier circuit 50 with the pin diode 105a, the withstand voltage of the bridge-rectifier circuit 50 against reverse voltages can be increased. Thus, IC cards difficult to be damaged by sudden electromagnetic induction can be provided.

Figure 8A:
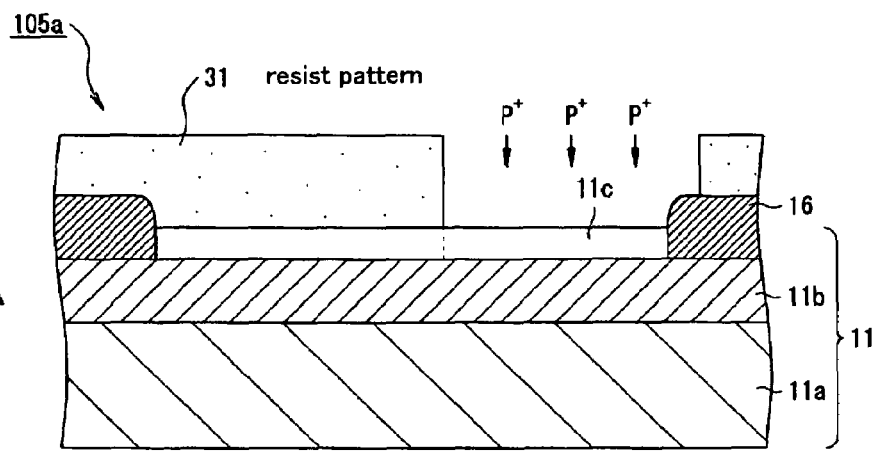
Figure 8B:
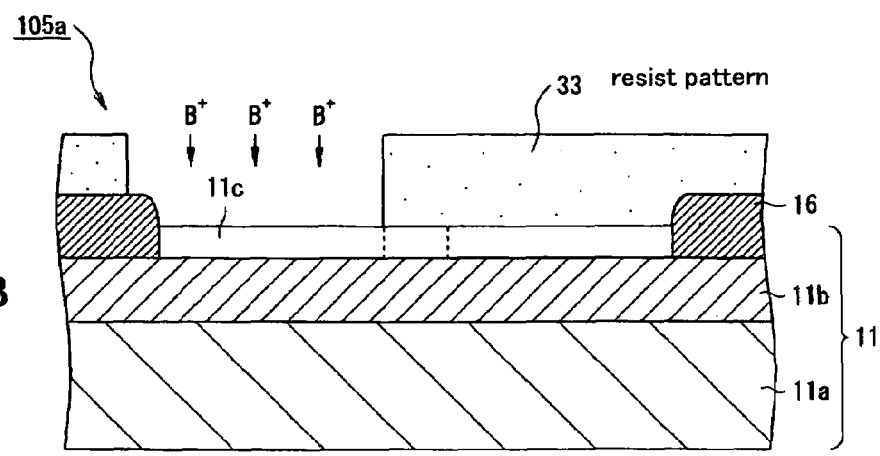

FIGS. 8(A) and 8(B) are cross-sectional views showing a manufacturing method of the pin diode 105a. In the manufacturing method of the pin diode 105a, the process for forming the component separation layer 16 on the SOI substrate 11 and the preceding processes are the same as those for the pn diode 5a, and accordingly the explanations therefore are omitted.

As shown in FIG. 8(A), after forming the component separation layer 16, a resist pattern 31 is formed on the SOI substrate 11 by photolithography process, the resist pattern having openings only corresponding positions to the areas to form the n-type layer (hereinafter referred to as n-type forming areas). At this point, the upper surfaces of the p-type forming areas and areas to form the i-type Si layer (hereinafter referred to as i-type forming areas) are covered by the resist pattern 31.

Next, using the resist pattern 31 as a mask, phosphorus is ion-implanted to the single-crystal silicon layer 11c in the n-type forming areas. The ion-implantation condition of phosphorus includes, for example, implanting energy of around 40 keV and dose amount of around $1\times10^{14}$-$10^{15}$ $cm^{-2}$.

Next, as shown in FIG. 8(B), a resist pattern 33 is formed on the SOI substrate 11 by photolithography process, the resist pattern having openings only corresponding positions to the p-type forming areas. At this point, the upper surfaces of the p-type forming areas and the i-type forming areas are covered by the resist pattern 33.

And then, using the resist pattern 33 as a mask, boron is ion-implanted to the single-crystal silicon layer 11c in the p-type forming areas. The ion-implantation condition of boron includes, for example, implanting energy of around 17 keV and dose amount of around $1\times10^{15}$-$5\times10^{15}$ $cm^{-2}$.

Consecutively, using the resist pattern 33 as a mask, germanium is further ion-implanted to the single-crystal silicon layer 11c where boron has been ion-implanted. The ion-implantation condition of germanium includes, for example, implanting energy of around 20 keV and dose amount of around $1\times10^{14}$-$5\times10^{15}$ cm$^{-2}$. The resist pattern 33 is then removed by ashing after the ion-implantation of germanium.

As described above, in the ion-implantation processes shown in FIGS. 8(A) and 8(B), boron and germanium are ion-implanted to the p-type areas, and phosphorus is ion-implanted to the n-type areas. And, any impurities such as phosphorus or boron are not ion-implanted to the i-type areas.

The succeeding processes are the same as those of the manufacturing method for the pn diode 5 as described above. That is, after activating by the thermal treatment the impurities such as germanium ion-implanted to both sides of the i-type areas, the inter-layer insulation film 17 (See FIG. 7.) is formed on the SOI substrate 11. And then, providing the contact holes in the inter-layer insulation film and forming the Al interconnections 19a and 19b complete the pin diode 105 as shown in FIG. 7(B).

In the third embodiment, the i-type Si layer 14 corresponds intrinsic silicon layer of the present invention, the pin diode 105a corresponds the diode of the present invention.

Note that the pin diode 105a has slightly smaller forward current than the pn diode 90a described above because of the inner electrical resistance. In order to avoid this lowering forward current, it is recommended that the n-type Si layer 15 is formed as a ring shape as in the second embodiment, the i-type Si layer 14 is also formed as a ring shape, and the p-type SiGe layer 13 is positioned in a center portion of the ring of the i-type Si layer 14. By thus structured, an area of the junction between the p-type SiGe layer 13 and the i-type Si layer 14 and an area of the junction between the i-type Si layer 14 and the n-type Si layer 15 can be increased to surely obtain a larger amount of electrical current.

Thus, while this invention has been described in conjunction with specific embodiments thereof, it is evident that many alternatives, modifications, and variations will be apparent to those skilled in the art. Accordingly, preferred embodiments of the invention as set forth herein are intended to be illustrative not limiting. Various changes may be made without departing from the spirit and scope of the invention.

What is claimed is:

1. A semiconductor device comprising:
a bridge-rectifier circuit that rectifies a predetermined alternating-current voltage to a direct-current voltage and that includes:
a plurality of diodes each of which includes:
an insulating substrate;
a p-type silicon layer, the p-type silicon layer containing germanium;
an intrinsic silicon layer joined to the p-type silicon layer; and
a n-type silicon layer joined to the intrinsic silicon layer,
the p-type silicon layer, the intrinsic silicon layer and the n-type silicon layer being disposed on the insulating substrate,
the n-type silicon layer being a ring shape,
the intrinsic silicon layer being surrounded by the n-type silicon layer, and
the p-type silicon layer being surrounded by the intrinsic silicon layer.

* * * * *